(12) United States Patent
Baek

(10) Patent No.: US 8,030,149 B2
(45) Date of Patent: Oct. 4, 2011

(54) METHOD FOR MANUFACTURING SEMICONDUCTOR DEVICE

(75) Inventor: In-Cheol Baek, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 283 days.

(21) Appl. No.: 12/245,752

(22) Filed: Oct. 5, 2008

(65) Prior Publication Data

US 2009/0146302 A1 Jun. 11, 2009

(30) Foreign Application Priority Data

Dec. 11, 2007 (KR) ........................ 10-2007-0128046

(51) Int. Cl.
*H01L 21/8238* (2006.01)

(52) U.S. Cl. ......... 438/199; 257/E21.636; 257/E21.026; 257/E21.259

(58) Field of Classification Search ............... 438/199, 438/275; 257/E29.156, E29.161, E21.199, 257/E21.622, E21.636, E21.026, E21.259
See application file for complete search history.

(56) References Cited

U.S. PATENT DOCUMENTS

| | | | |
|---|---|---|---|
| 6,455,904 B1 * | 9/2002 | Noda | 257/393 |
| 2004/0157469 A1 * | 8/2004 | Ito | 438/759 |
| 2007/0099126 A1 * | 5/2007 | Chang et al. | 430/313 |

* cited by examiner

*Primary Examiner* — Minh-Loan T Tran
*Assistant Examiner* — Leslie Pilar Cruz
(74) *Attorney, Agent, or Firm* — Sherr & Vaughn, PLLC

(57) ABSTRACT

Embodiments relate to a method for manufacturing a semiconductor device, and in particular to a method for manufacturing a semiconductor device capable of simplifying a silicide manufacturing process using a photo resist overhang structure. According to embodiments, a surface is subjected to a monochlorobenzene coating processing to cure the surface of the exposed photo resist so as not to react with developing solution and such a processed photo resist is developed to make the lower of the photo resist in the overhang structure so as to form an accurate pattern according to the clear removal of the oxide film, making it possible to simply manufacture the silicide and the non-silicide without performing an etching process by a subsequent cobalt deposition process.

12 Claims, 5 Drawing Sheets

*-Related Art-*

*-Related Art-*

SILICIDE REGION    NON-SILICIDE REGION

METHOD FOR MANUFACTURING SEMICONDUCTOR DEVICE

The present application claims priority under 35 U.S.C. 119 to Korean Patent Application No. 10-2007-0128046 (filed on Dec. 11, 2007), which is hereby incorporated by reference in its entirety.

BACKGROUND

Embodiments relate to a method for manufacturing a semiconductor device, and more particularly to a method for manufacturing a semiconductor device capable of simplifying a silicide manufacturing process using a photo resist overhang structure. In a method for manufacturing a general semiconductor integrated circuit, a source-drain diffusing region and a gate electrode of a transistor may be formed and may then be contacted to a metal wiring to electrically connect them to the outside. Sheet resistance of both a shallow source-drain diffusing region and a thin polycrystalline silicon gate formed according to a scale down of a transistor should preferably be reduced to 10 to 20 ohms/m$^2$ or less. However, since the sheet resistance cannot be reduced to the 10 to 20 ohms/m$^2$ or less, utility as an interconnection medium may be reduced.

As a method for solving the problem and improving the interconnection, silicide with a low specific resistance value may be formed on and/or over the silicon of the gate or the source-drain region. The process of forming the silicide may be accomplished by deposition metal silicide. For example, metals such as nickel Ni or cobalt Co may be deposited, and may form a metal silicide by heat process. A self aligned silicide process may be used. Such a process may form the silicide only on an active region, made of silicon and a polysilicon as gate forming material, and may not form it on the remaining insulating material.

Since the region formed with the silicide has relatively low resistance, the process cannot be applied to a region that requires high resistance. Therefore, a non-salicide process, which covers a region where the silicide should not be formed with an insulating film and forms the silicide in other regions, is needed. To this end, an oxide film may be used as a silicide mask.

The process will be described with reference to FIG. 1. First, as shown in FIG. 1, gate electrode 4 may be formed on and/or over a surface of semiconductor substrate 1 and gate spacer 6 may then be formed on a side wall of gate electrode 4. Silicon oxide film 2 may be deposited over the resultant, for example by a chemical vapor deposition (CVD) method, or a similar method. Silicon oxide film 2 may be used as a silicide mask.

Figure 1A:
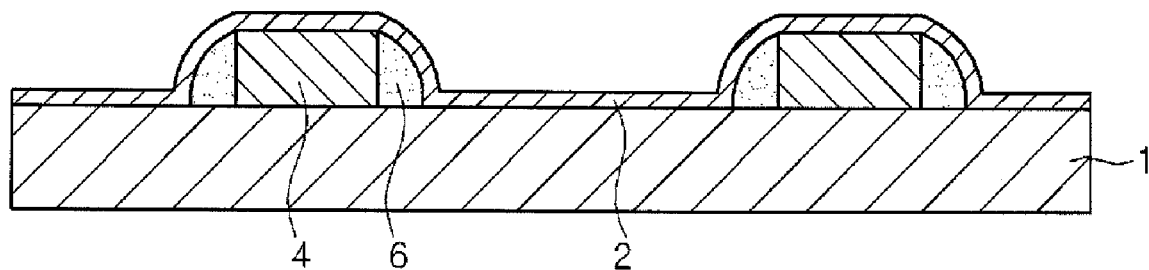
Figure 1B:
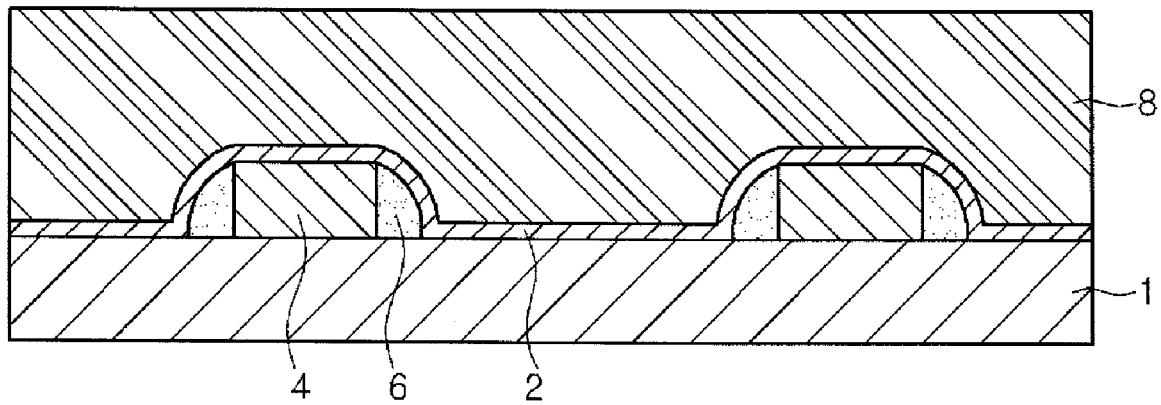

Then, referring to FIG. 1B, photo resist coating film 8 may be applied on and/or over an upper portion of the deposited silicon oxide 2, for example by a spin coating method, or a similar method.

Figure 1C:
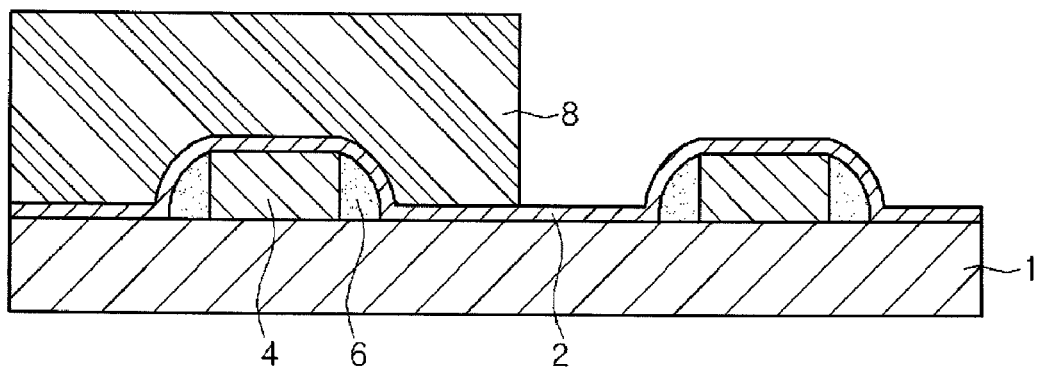

Next, referring to FIG. 1C, a patterning to define a silicide region and a non-salicide region may be performed through a photolithography process, for example by an exposure method, a development method, or the like to open only a region to be silicided.

Figure 1D:
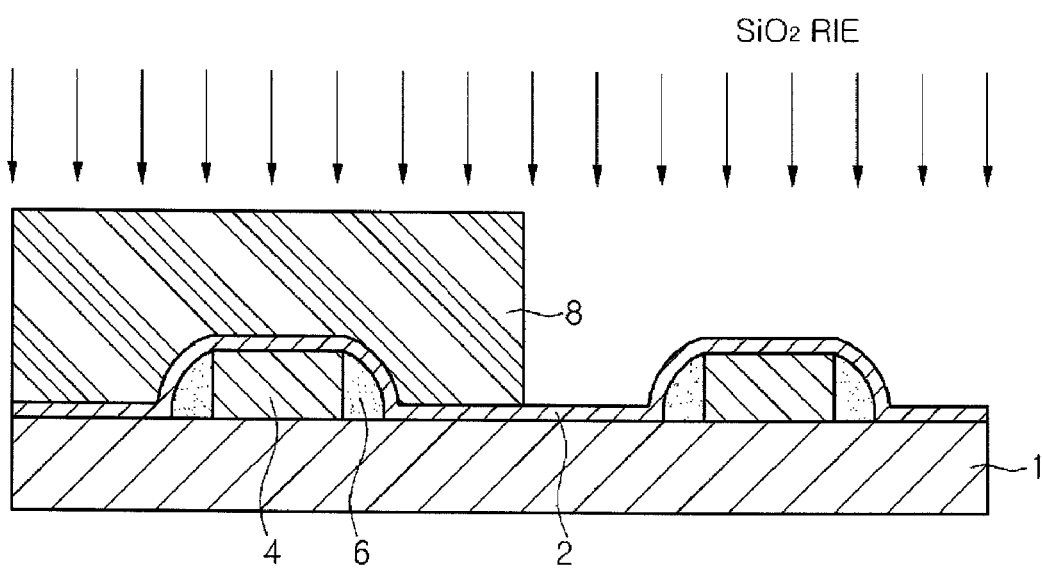
Figure 1E:
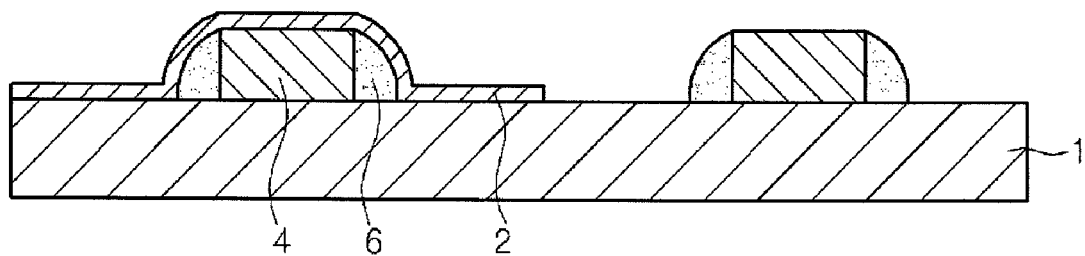

Referring to FIG. 1D, silicon oxide film 2 in the region to be silicided, as shown in FIG. 1E, may be removed through a process such as a reactive ion etching (RIE), or a similar process. At approximately the same time, photo resist coating film 8 in the non-salicide may be removed by a strip.

Figure 1F:
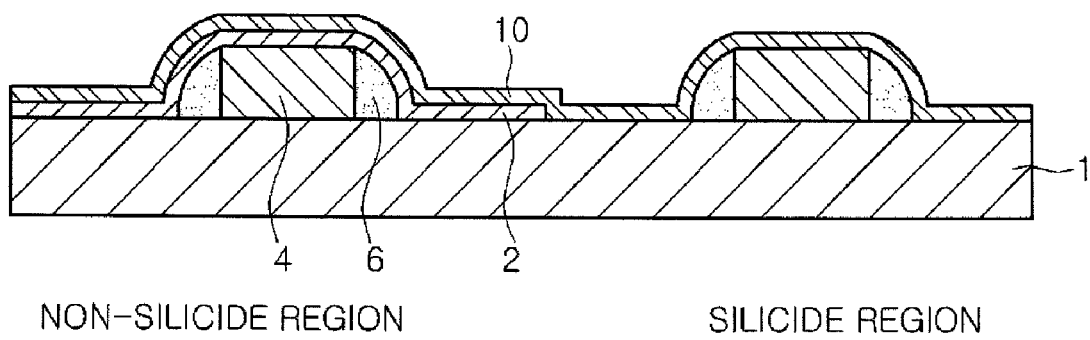

Referring to FIG. 1F, the non-salicide/silicide may be manufactured through annealing after depositing cobalt Co film 10.

However, the related art silicide process is complicated, which may tend to degrade the yield of semiconductor devices.

SUMMARY

Embodiments relate to semiconductor device and a method for manufacturing a semiconductor device, and more particularly to a method for manufacturing a semiconductor device that simplifies a silicide manufacturing process using a photo resist overhang structure.

According to embodiments, a method for manufacturing a semiconductor device may include at least one of the following steps: Forming a gate and a gate spacer formed on a side wall of the gate on a semiconductor substrate. Forming a first oxide film over the semiconductor substrate formed with the gate and the gate spacer. Forming a photo resist pattern in an overhang structure to cover a silicide region on the first oxide film. Forming a second oxide film over the semiconductor substrate formed with the photo resist pattern. Removing a second oxide film in the silicide region by stripping the photo resist pattern and making the second oxide film remain on the first oxide film in the non-salicide region. Removing the second oxide film to expose the upper surface of the gate and the semiconductor substrate of the silicide region and making the first oxide film remain in the non-salicide region. Depositing a metal film on the semiconductor substrate. Annealing the semiconductor substrate to form silicide in the silicide region.

According to embodiments, a surface may be subjected to a monochlorobenzene coating processing to cure the surface of the exposed photo resist so as not to react with a developing solution and such a processed photo resist may be developed to make the lower of the photo resist in the overhang structure so as to form an accurate pattern according to the clear removal of the oxide film, making it possible to simply manufacture the silicide and the non-silicide without performing an etching process by a subsequent cobalt deposition process.

DRAWINGS

FIGS. 1A to 1F are process cross-sectional views illustrating a related art semiconductor device and a method for manufacturing a related art semiconductor device.

Example FIGS. 2A to 2D are process cross-sectional views illustrating a semiconductor device and a method for manufacturing a semiconductor device according to embodiments.

DESCRIPTION

Hereinafter, a method for manufacturing a semiconductor device according to the embodiments will be described with reference to the accompanying drawings. Referring to FIGS. 2A to 2D, a method for forming silicide of a semiconductor device according to embodiments will be described.

Figure 2A:
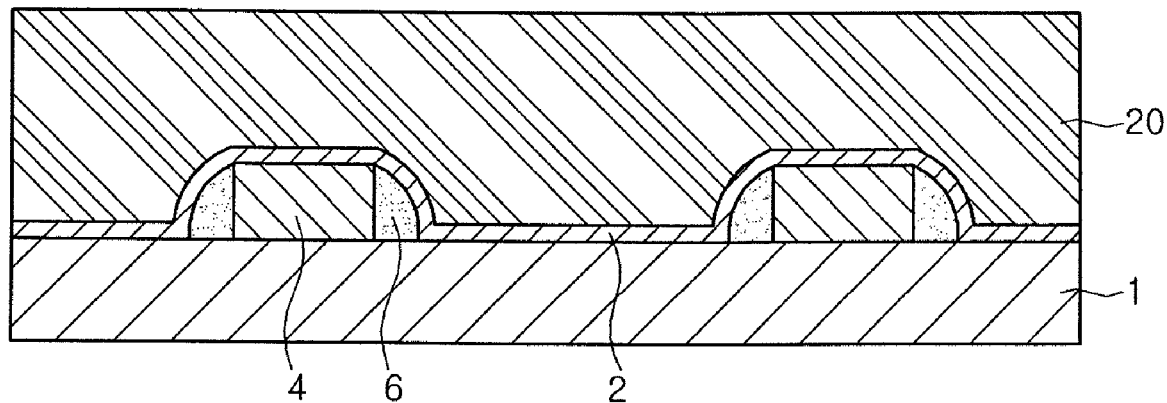

Referring to FIG. 2A, gate electrode 4 may be formed on and/or over a surface of semiconductor substrate 1 and gate spacer 6 may then be formed on a side wall of gate electrode 4. Silicon oxide 2 may be deposited over the resultant, for example by chemical vapor deposition (CVD), or any other known method. According to embodiments, silicon oxide film 2 is used as the silicide mask.

The silicide mask may be formed only the non-salicide region and may be interposed between the silicide metal film and the semiconductor substrate in the silicide process later, so as not to react the metal film with the semiconductor. Then, photo resist coating film 20 may be applied on and/or over an upper portion of the deposited silicon oxide film 2, for example by a spin coating method, or any similar method.

After photo resist coating film 20 is applied, a patterning defining the non-salicide region and the silicide may be performed using it as a mask through a photolithography process, such as exposure and development, or any similar process. In this way, only the non-salicide region is opened. According to embodiments, photo resist coating film 20 covers the silicide region and exposes silicon oxide film 2 in the non-salicide region.

According to embodiments, it is preferable that a higher amount of energy be used than the amount used in a general process, so as to make an undercut on a lower portion of the photo resist coating film. According to embodiments, the exposure is performed with an energy level of approximately 300 to 450 mJ and a monochlorobenzene (MCB) coating processing is performed. If the monochlorobenzene coating processing is performed, a surface of the exposed photo resist may be reformed and cured so that it does not react with the developing solution.

Photo resist coating film 20 subjected to the MCB coating processing may then be developed. As a result, a surface of the exposed photo resist remains and the non-exposed photo resist is removed.

Figure 2B:
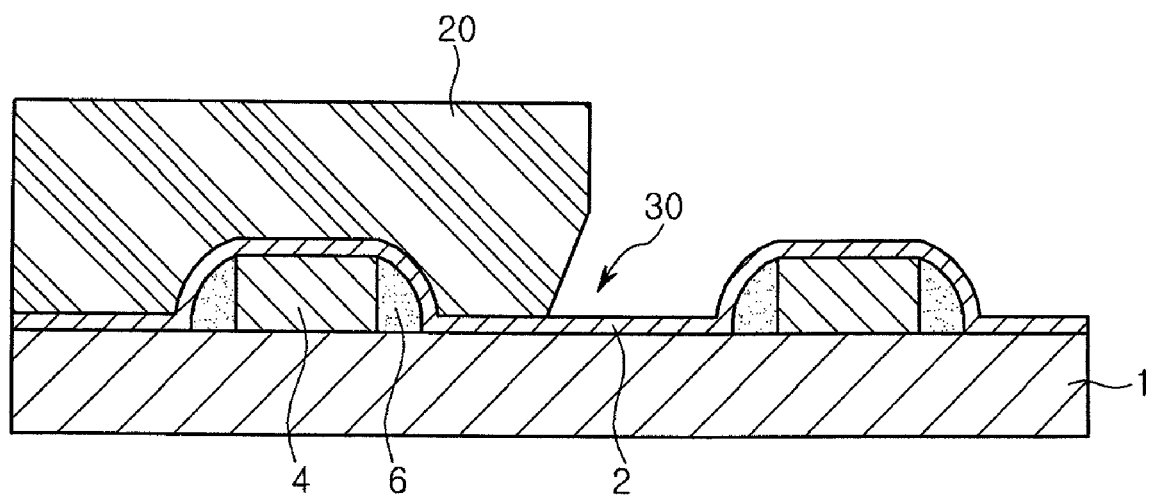

Referring to FIG. 2B, with the development process, overhang structure 30 may be formed such that it substantially has a form where a lower portion of photo resist coating film 20 is removed and is recessed, and an upper portion thereof is projected toward the side portion. According to embodiments, if there is no overhang structure 30 in photo resist coating film 20, when the oxide film is deposited in the non-salicide region, the oxide film deposited on a position formed with photo resist coating film 20 may not be clearly removed, which may make it difficult to form an accurate pattern.

Figure 2C:
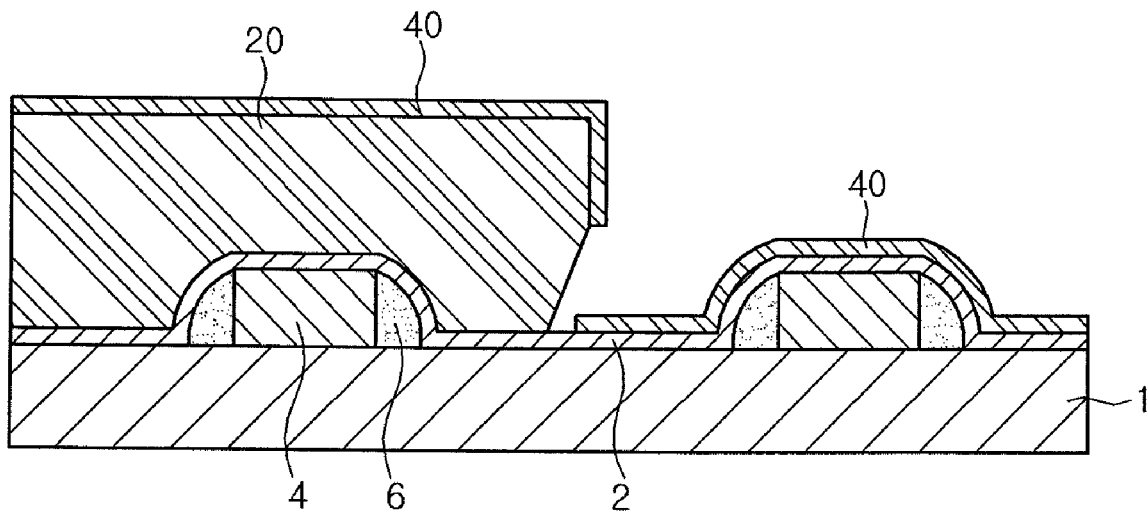

Referring to FIG. 2C, an oxide film may be deposited using a low temperature oxide (LTO) process. According to embodiments, if the depositing temperature of oxide film 40 becomes high, photo resist coating film 20 may become deformed. This deformation may make it difficult or impossible to form an accurate pattern. According to embodiments, the depositing thickness of oxide film 40 is approximately 50 to 200 Å

Figure 2D:
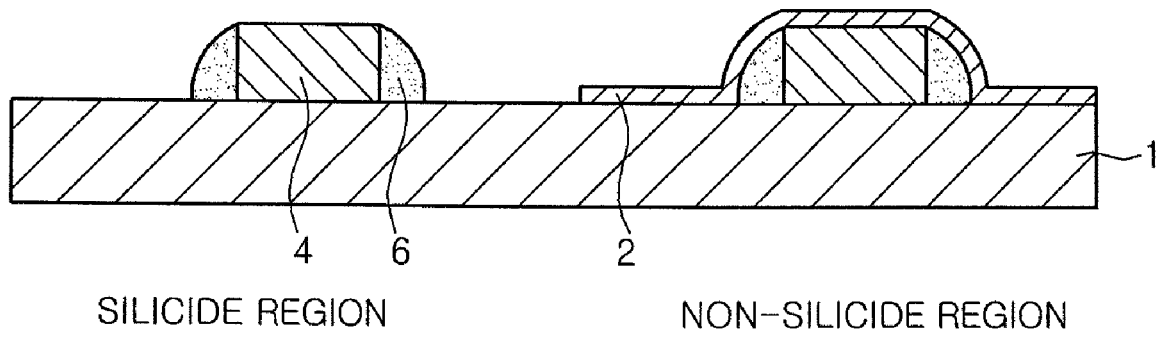

Referring to FIG. 2D, if photo resist coating film 20 is stripped, photo resist coating film 20 formed in the silicide region and oxide film 40 formed on photo resist coating film 20 may be removed together. In the process of stripping photo resist coating film 20, the strip solution may get into the side of the photo resist coating film due to the overhang structure of photo resist coating film 20. This may make it possible to remove photo resist coating film 20 and oxide film 40 on photo resist coating film 20. Thus, according to embodiments, oxide film 40 forms a gap on the side of the photo resist coating film. Hence, a gap may be formed between oxide film 40 and the side of the photo resist coating film.

If photo resist coating film 20 is removed, only silicon oxide film 2 remains in the silicide region and silicon oxide film 2 and oxide film 40 remain in the non-silicide region. Thereafter, oxide film 40 may be removed to expose the semiconductor substrate and the upper surface of the gate in the silicide region. The silicon oxide film remains as the silicide mask in the non-silicide region.

Thereafter, similar to the related art, a cobalt Co film may be deposited over the semiconductor substrate formed with the silicide mask and the silicide/non-salicide may be formed through the annealing.

According to embodiments, a surface may be subjected to a monochlorobenzene coating processing to cure the surface of the exposed photo resist so as not to react with the developing solution. Such a processed photo resist may be developed to make an overhang structure at a lower portion of the photo resist. This may result in formation of an accurate pattern due to the clear removal of the oxide film, which may simplify manufacturing of the silicide and the non-silicide without performing an etching process by a subsequent cobalt depositing process.

According to embodiments, a method for manufacturing a semiconductor device forms the silicide/non-salicide without performing the etching process, unlike the related art. This may simplify the manufacturing process.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a gate and forming a gate spacer on a side wall of the gate over a semiconductor substrate including a silicide region and a non-silicide region;
   forming a first oxide film over the semiconductor substrate including the gate and the gate spacer;
   forming a photo resist pattern in an overhang structure on the first oxide film in the silicide region to expose the first oxide film in the non-silicide region;
   forming a second oxide film over the semiconductor substrate including the photo resist pattern;
   removing the second oxide film from the photo resist pattern in the silicide region while maintaining the second oxide film over the first oxide film in the non-silicide region; and then
   removing the first oxide film to expose an upper surface of the gate and the semiconductor substrate of the silicide region while maintaining the first oxide film in the non-silicide region.

2. The method of claim 1, wherein removing the second oxide film from the silicide region comprises stripping the photo resist pattern.

3. The method of claim 1, wherein forming the photo resist pattern in the overhang structure comprises:
   selectively exposing a photo resist film in the non-silicide region through a mask;
   performing a monochlorobenzene (MCB) coating process on the selectively exposed photo resist film; and
   forming the photo resist pattern in the overhang structure exposing the non-silicide region by developing the photo resist film subjected to the MCB coating process.

4. The method of claim 3, wherein an exposure energy is in a range of approximately 300 mJ to 450 mJ when selectively exposing the photo resist film through a mask so as to form an undercut on a lower portion of the photo resist pattern.

5. The method of claim 3, wherein a surface of the exposed photo resist film is reformed and cured when performing the monochlorobenzene coating process.

6. The method of claim 5, wherein the surface of the exposed photo resist film does not react with a developing solution.

7. The method of claim 1, wherein the first oxide film compromises a silicon oxide film deposited with a chemical vapor deposition (CVD) process.

8. The method of claim 1, wherein a depositing thickness of the second oxide film is between approximately 50 Å to 200 Å.

9. The method of claim 1, wherein the second oxide film is formed using a low temperature oxide process.

10. The method of claim 1, wherein the overhang structure of the photo resist pattern has a form that a lower portion of photo resist coating film is removed so as to be recessed and an upper portion thereof is substantially projected toward a side portion.

11. The method of claim 1, wherein the second oxide film over the photo resist pattern is removed when the photo resist pattern is stripped.

12. The method of claim 1, wherein the second oxide film is formed to have a gap at a side of the photo resist pattern.

* * * * *